US008968989B2

(12) United States Patent
Ouattara et al.

(10) Patent No.: US 8,968,989 B2
(45) **Date of Patent: *Mar. 3, 2015**

(54) ASSIST LAYERS FOR EUV LITHOGRAPHY

(71) Applicant: Brewer Science Inc., Rolla, MO (US)

(72) Inventors: Tantiboro Ouattara, Eureka, MO (US); Carlton Washburn, Rolla, MO (US); Vandana Krishnamurthy, Rolla, MO (US); Douglas Guerrero, Rolla, MO (US); Aline Collin, Fairbanks, AK (US)

(73) Assignee: Brewer Science Inc., Rolla, MO (US)

( * ) Notice: Subject to any disclaimer, the term of this patent is extended or adjusted under 35 U.S.C. 154(b) by 33 days.

This patent is subject to a terminal disclaimer.

(21) Appl. No.: 13/682,050

(22) Filed: Nov. 20, 2012

(65) Prior Publication Data

US 2013/0129995 A1 May 23, 2013

Related U.S. Application Data

(60) Provisional application No. 61/562,166, filed on Nov. 21, 2011.

(51) Int. Cl.

| | |
|---|---|
| ***G03F 7/26*** | (2006.01) |
| ***G03F 7/09*** | (2006.01) |
| ***G03F 7/20*** | (2006.01) |
| ***G03F 7/11*** | (2006.01) |
| *B82Y 30/00* | (2011.01) |
| *B82Y 40/00* | (2011.01) |

(52) U.S. Cl.

CPC .............. *G03F 7/092* (2013.01); *G03F 7/2004* (2013.01); *G03F 7/11* (2013.01); *B82Y 30/00* (2013.01); *Y10S 977/755* (2013.01); *B82Y 40/00* (2013.01)

USPC ............................ 430/323; 430/322; 977/755

(58) Field of Classification Search

CPC ............. G03F 7/092; G03F 7/11; G03F 7/20; G03F 7/2004

USPC .................................................. 430/322, 323

See application file for complete search history.

(56) References Cited

U.S. PATENT DOCUMENTS

| | | | | |
|---|---|---|---|---|
| 6,140,023 | A * | 10/2000 | Levinson et al. | 430/313 |
| 6,740,469 | B2 | 5/2004 | Krishnamurthy et al. | |
| 8,257,910 | B1 | 9/2012 | Guerrero et al. | |
| 2007/0148602 | A1 | 6/2007 | Lee et al. | |
| 2009/0123878 | A1 | 5/2009 | Miyoshi et al. | |
| 2009/0297784 | A1 | 12/2009 | Xu et al. | |
| 2011/0123779 | A1 | 5/2011 | Fuller et al. | |

FOREIGN PATENT DOCUMENTS

JP 2002-198283 7/2002

OTHER PUBLICATIONS

Goldberg et al., "An EUV Fresnel zoneplate mask-imaging microscope for lithography generations reaching 8 nm," Proc. of SPIE, 2011, vol. 7969, 796910-1-796910-12.

Roberts et al., "Sensitivity of EUV resists to out-of-band radiation," Proc. of SPIE, 2009, vol. 7273, 72731W-1-72731W-13.

Xu et al., "Underlayer designs to enhance the performance of EUV resists," Proc. of SPIE, 2009, vol. 7273, 72731J-1-72731J-11.

International Search Report and Written Opinion dated Mar. 4, 2013 in corresponding PCT/US2012/066074 filed Nov. 20, 2012.

Thackeray et al., "EUV Resists based on Low Acid Diffusion," Dow Electronic Materials, 2009 International Symposium on Extreme Ultraviolet Lithography, Oct. 19, 2009, 31 pages.

Meagley, Robert P., "Fundamental Challenges for Lithographic Roadmap," Intel Corporation, Sep. 16, 2004, NSF/SRC ERC, 14 pages.

Meagley, Robert P., Manager, Lithography, Fab Materials Operation (FMO), Intel Corporation, J. Vac. Sci. Tech. B, 24(4), Jul./Aug. 2006, pp. 1822-1826.

* cited by examiner

*Primary Examiner* — Kathleen Duda

(74) *Attorney, Agent, or Firm* — Hovey Williams LLP

(57) ABSTRACT

The present invention provides novel methods of fabricating microelectronics structures, and the resulting structures formed thereby, using EUV lithographic processes. The method involves utilizing an assist layer immediately below the photoresist layer. The assist layer can either be directly applied to the substrate, or it can be applied to any intermediate layer(s) that may be applied to the substrate. The preferred assist layers are formed from spin-coatable, polymeric compositions. The inventive method allows reduced critical dimensions to be achieved with improved dose-to-size ratios, while improving adhesion and reducing or eliminating pattern collapse issues.

15 Claims, 18 Drawing Sheets

ASSIST LAYERS FOR EUV LITHOGRAPHY

RELATED APPLICATIONS

The present application claims the priority benefit of U.S. Provisional Patent Application Ser. No. 61/562,166, filed Nov. 21, 2011, entitled ASSIST LAYERS FOR EUV LITHOGRAPHY, incorporated by reference in its entirety herein.

BACKGROUND OF THE INVENTION

1. Field of the Invention

This invention is concerned with methods of fabricating microelectronic structures using EUV (extreme ultraviolet) lithography.

2. Description of the Prior Art

As the semiconductor industry continues to follow Moore's law, the demand for ever-decreasing feature sizes requires the use of thinner films to prevent pattern collapse. Thinner films will require using a hardmask to transfer the pattern to the substrate. Extreme ultraviolet (EUV) exposure is expected to be the method of choice for single exposure lithography to achieve the required critical dimension (CD) targets of the 22-nm node and beyond. Unfortunately, EUV lithography has been hindered by a number of problems, one of the most notable being a lack of powerful radiation sources. Because of the limited amount of energy available, lithography performance can suffer, and long exposure times are needed, resulting in low throughput. One solution to this problem is to improve the sensitivity of EUV resists. This sensitivity can be further defined by the amount of energy, also called dose, needed to reach a certain feature size, or more simply put, dose to size.

The main challenge in material design, particularly with resists, is to simultaneously achieve the improvement in line width roughness (LWR) and sensitivity necessary for industry targets. LWR is a measure of the variation of the width of the lines formed by photolithography. Sensitivity is the minimum dose of energy necessary to image the photoresist. The International Technology Roadmap for Semiconductors has set targets for 3 sigma LWR at <3 nm, and for sensitivity at <10 $mJ/cm^2$. Most currently available resists do not meet both targets and tend to achieve a compromise between LWR and sensitivity. Numerous attempts have been made to improve resist sensitivity while improving LWR. Among the various approaches is incorporating a photoacid generator (PAG) functionality into the resist polymer. Such methods are limited to the maximum or minimum amount of PAG that must be present in the polymer formulation for optimum lithographic performance. It is also synthetically challenging to obtain the ideal PAG composition for incorporation into a polymer backbone.

In another approach for resist design, halogens have been used in an attempt to increase resist absorbance to reduce LWR and increase sensitivity. This approach is promising, but the resist needs a certain level of transparency to minimize tapering that can occur at the bottom of the resist. Tapering is caused by the difference in light absorption that occurs as photons travel from the top of the resist to the bottom of the resist. It has also been suggested that resist absorbance and secondary electron generation by EUV irradiation play an important role in acid generation that can improve LWR and sensitivity. However, as discussed above, there are limitations on the increase in absorbance that can be achieved in a resist film before tapering occurs.

There is a need for EUV methods that improve LWR, while simultaneously having the necessary sensitivity.

SUMMARY OF THE INVENTION

The present invention overcomes the problems of the prior art by providing a method of forming a structure, where the method comprises providing a substrate that optionally includes one or more intermediate layers thereon. An assist layer is formed on the substrate, or on the one or more intermediate layers, if present. The assist layer is a cured film comprising at least about 0.01% by weight metal, based upon the total weight of the cured film taken as 100% by weight. A photoresist layer is formed on the assist layer, and at least a portion of the photoresist is subjected to EUV radiation.

The invention also provides a structure comprising a substrate, with the substrate optionally including one or more intermediate layers thereon. There is an assist layer on the substrate, or on the one or more intermediate layers, if present. The assist layer is a cured film comprising at least about 0.01% by weight metal, based upon the total weight of the cured film taken as 100% by weight. The assist layer also has a thickness of from about 1 nm to about 100 nm. Finally, there is a photoresist layer on the assist layer.

DETAILED DESCRIPTION OF THE PREFERRED EMBODIMENTS

The Inventive Method

Figure 1:
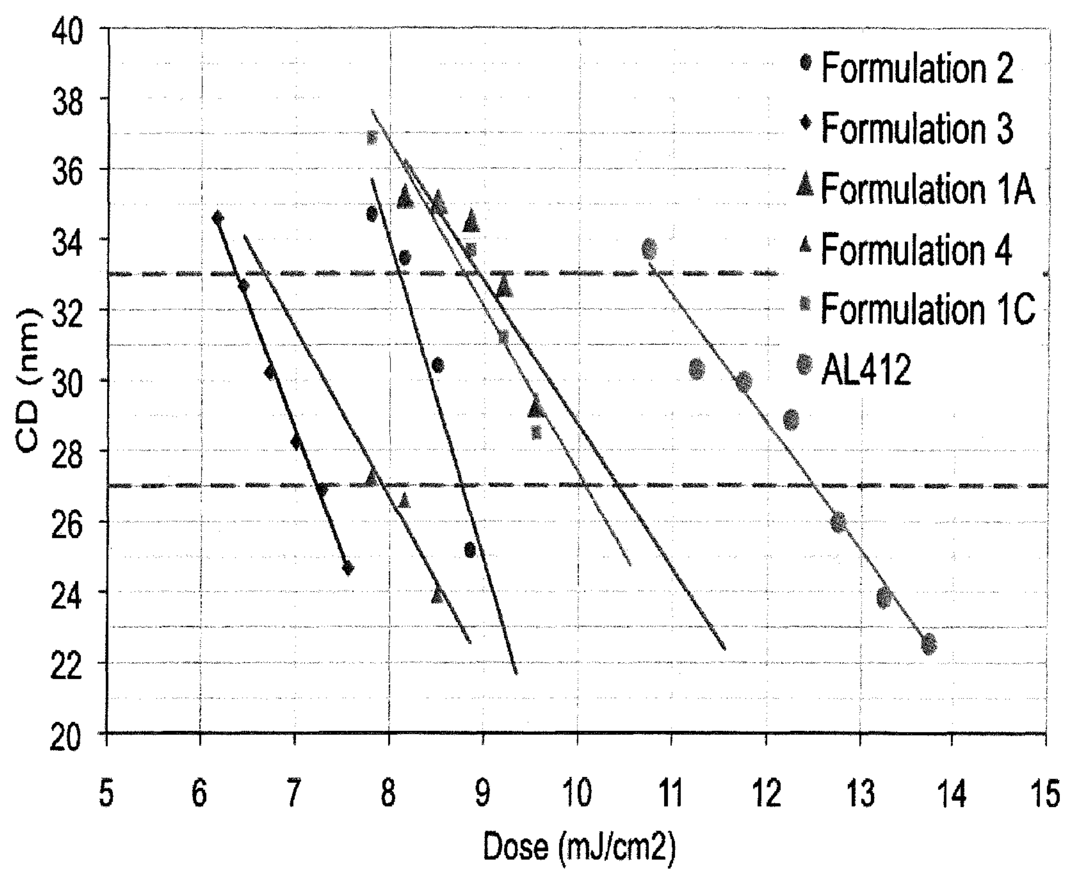
FIG. 1 is a graph depicting the dose to size ratio for 30-nm lines.
Figure 2:
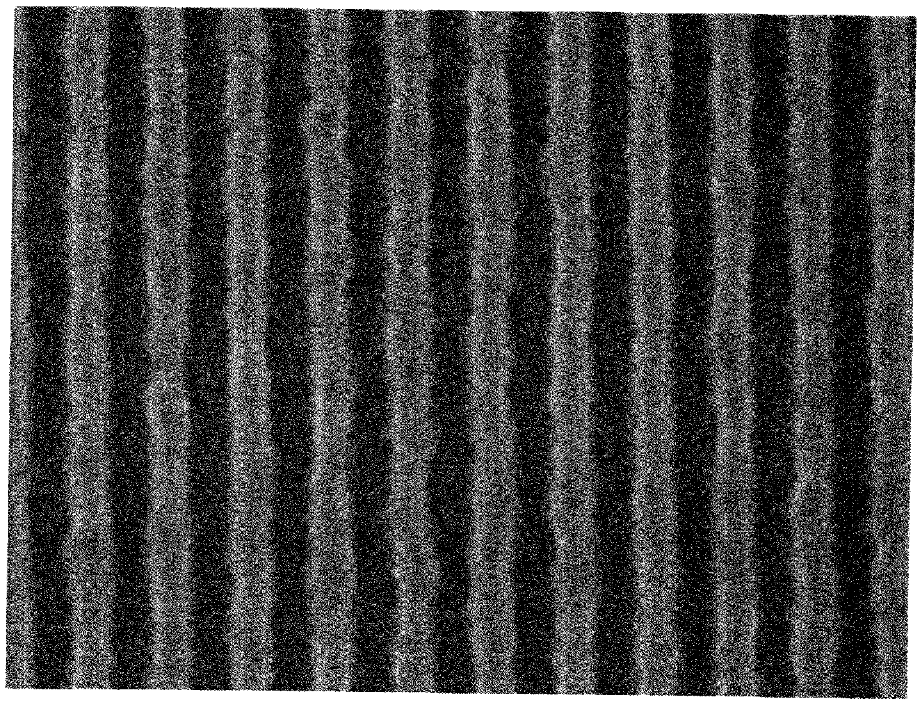
FIG. 2 is a Scanning Electron Microscope (SEM) photograph showing a top-down view of 30-nm lines using Formulation 1A.
Figure 3:
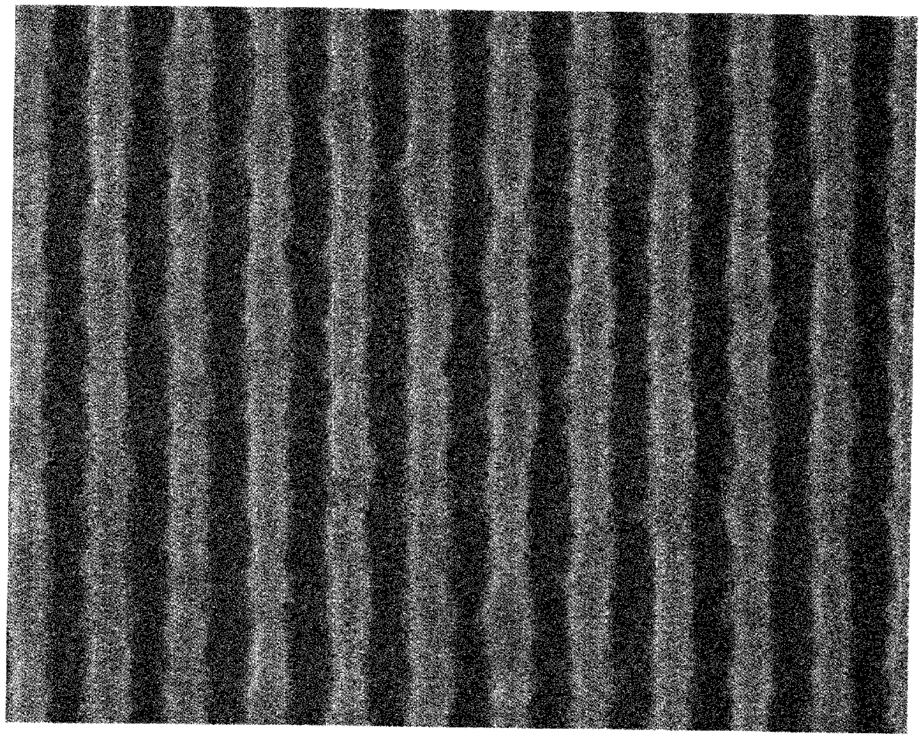
FIG. 3 is an SEM photograph showing a top-down view of 30-nm lines using Formulation 1C.
Figure 4:
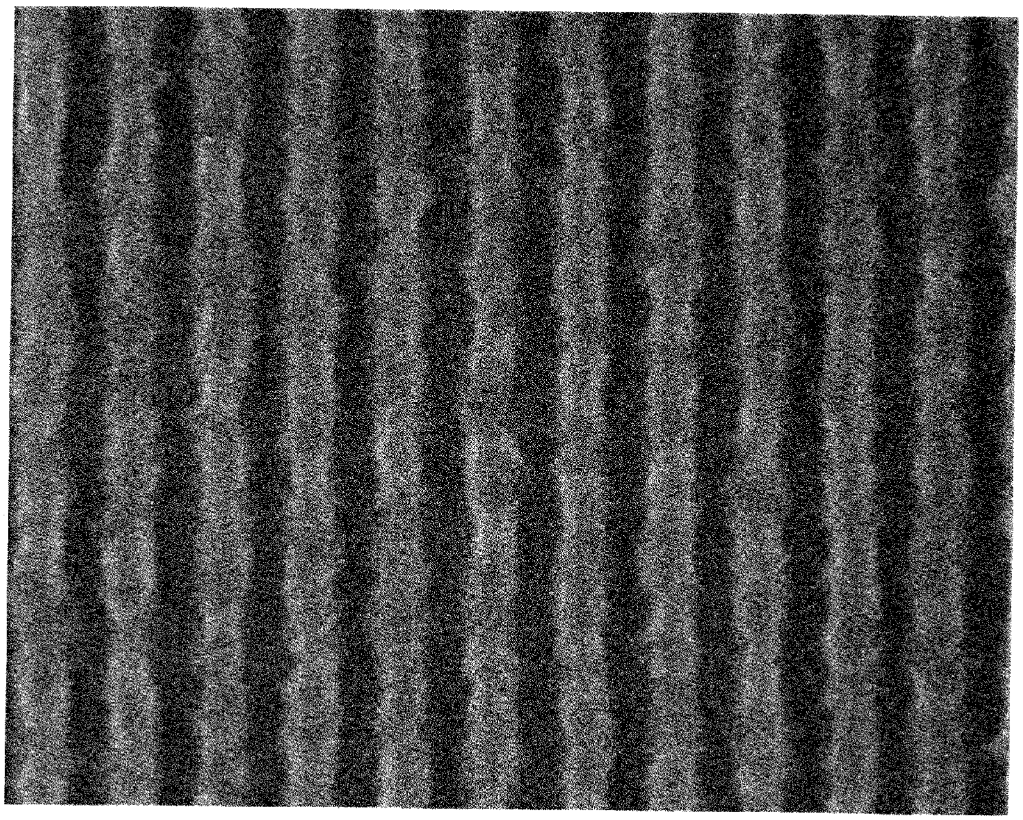
FIG. 4 is an SEM photograph showing a top-down view of 30-nm lines using Formulation 2.
Figure 5:
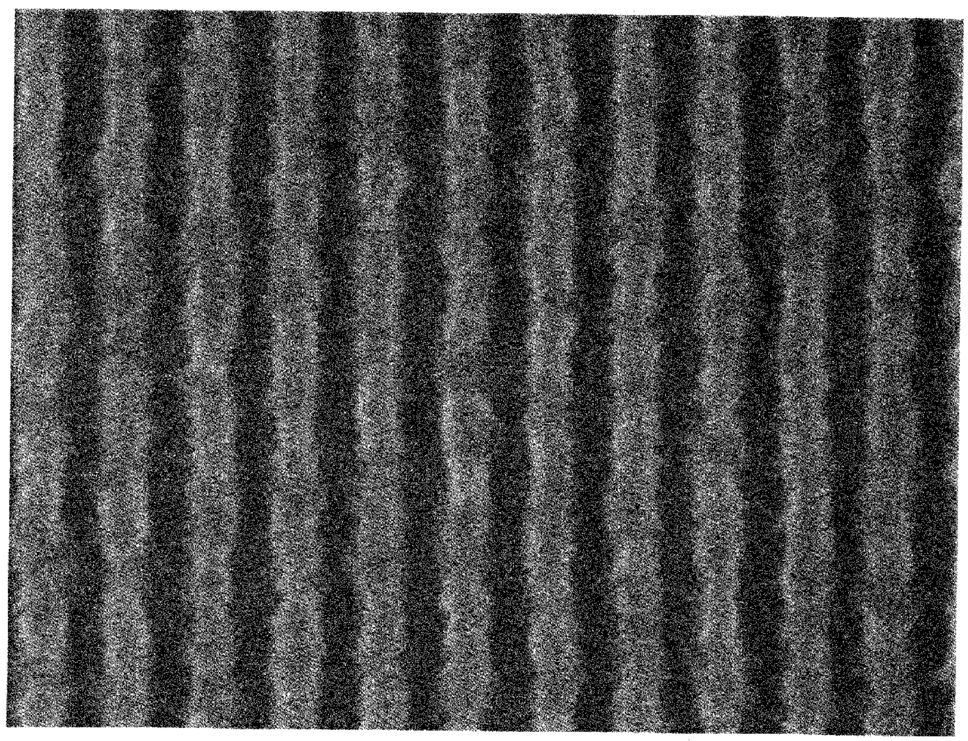
FIG. 5 is an SEM photograph showing a top-down view of 30-nm lines using Formulation 3.
Figure 6:
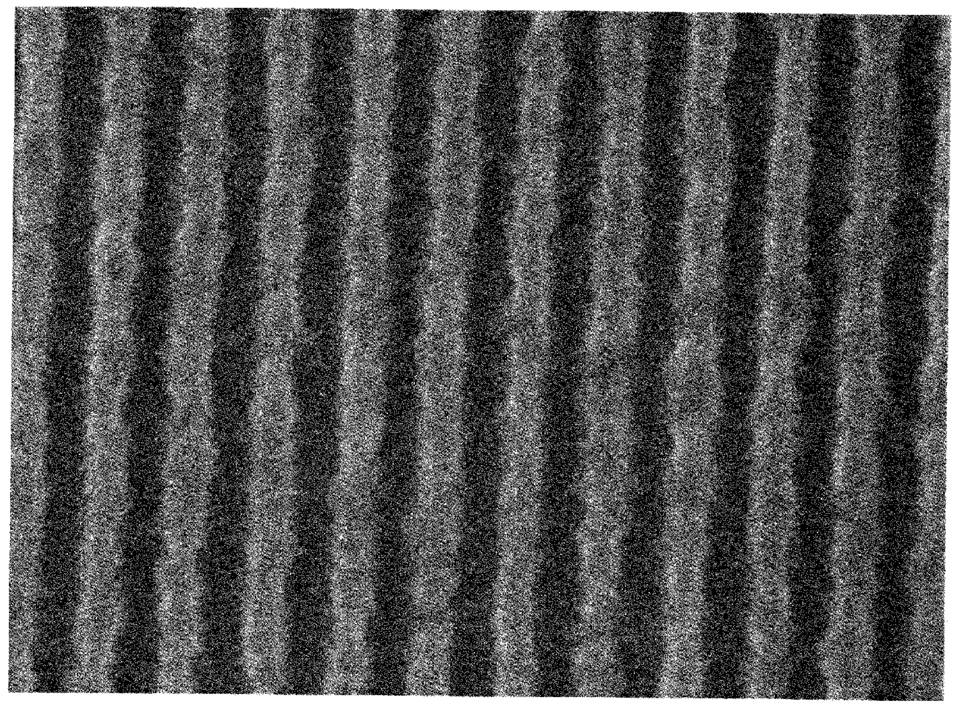
FIG. 6 is an SEM photograph showing a top-down view of 30-nm lines using Formulation 4.
Figure 7:
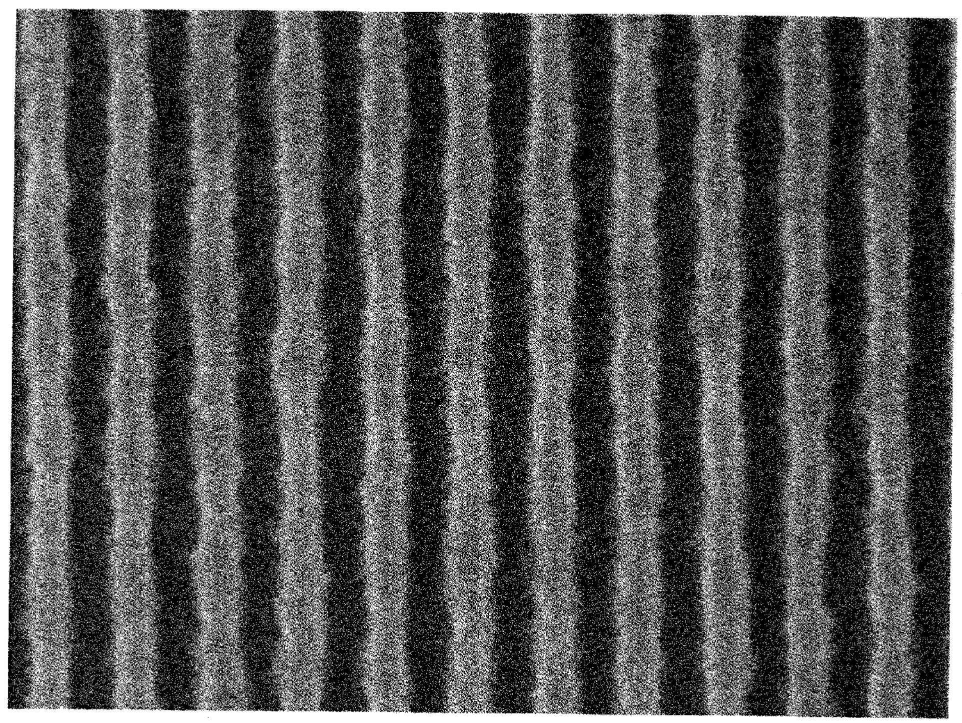
FIG. 7 is an SEM photograph showing a top-down view of 30-nm lines using the $E^2$Stack® AL412.
Figure 8:
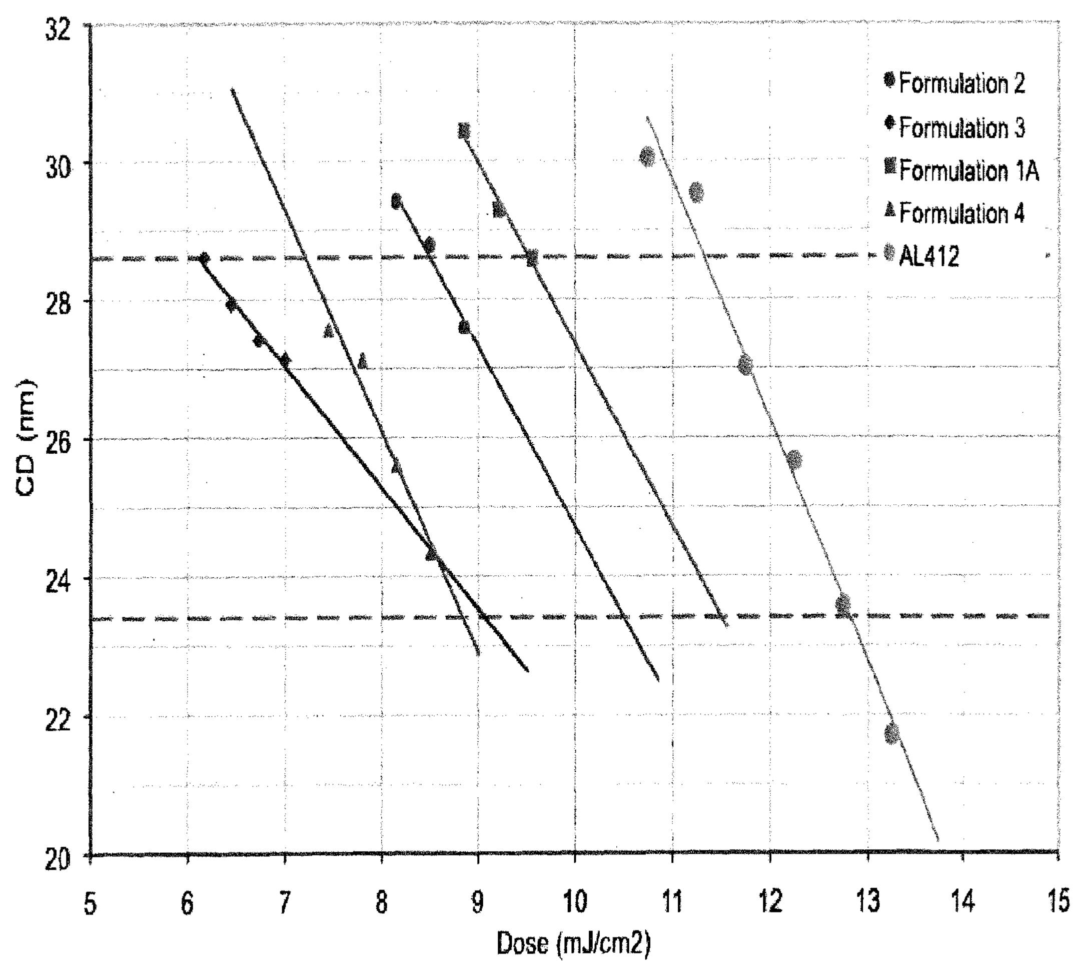
FIG. 8 is a graph depicting the dose to size ratio for 26-nm lines.
Figure 9:
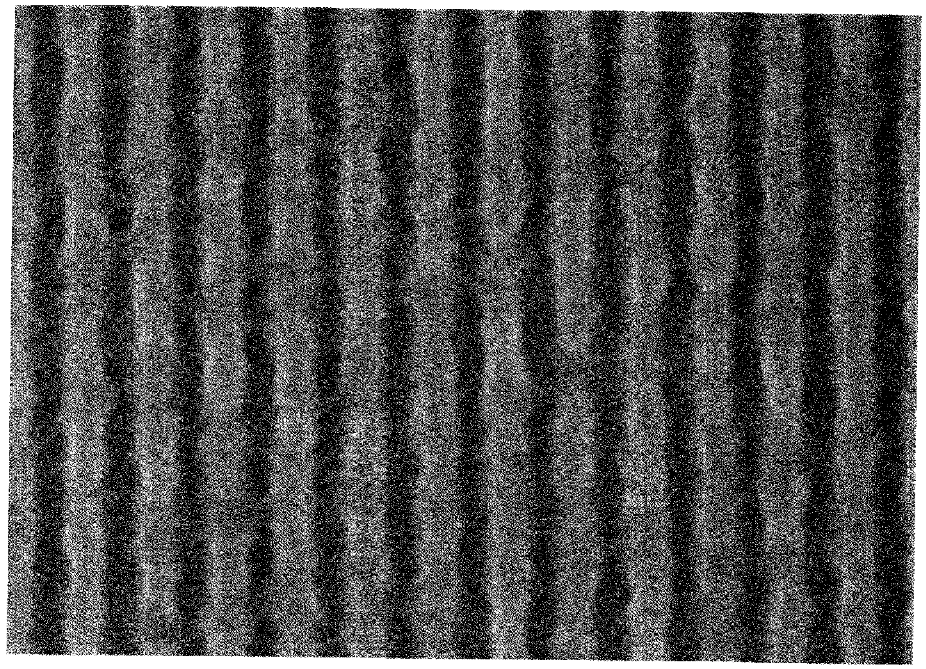
FIG. 9 is an SEM photograph showing a top-down view of 26-nm lines using Formulation 1A.
Figure 10:
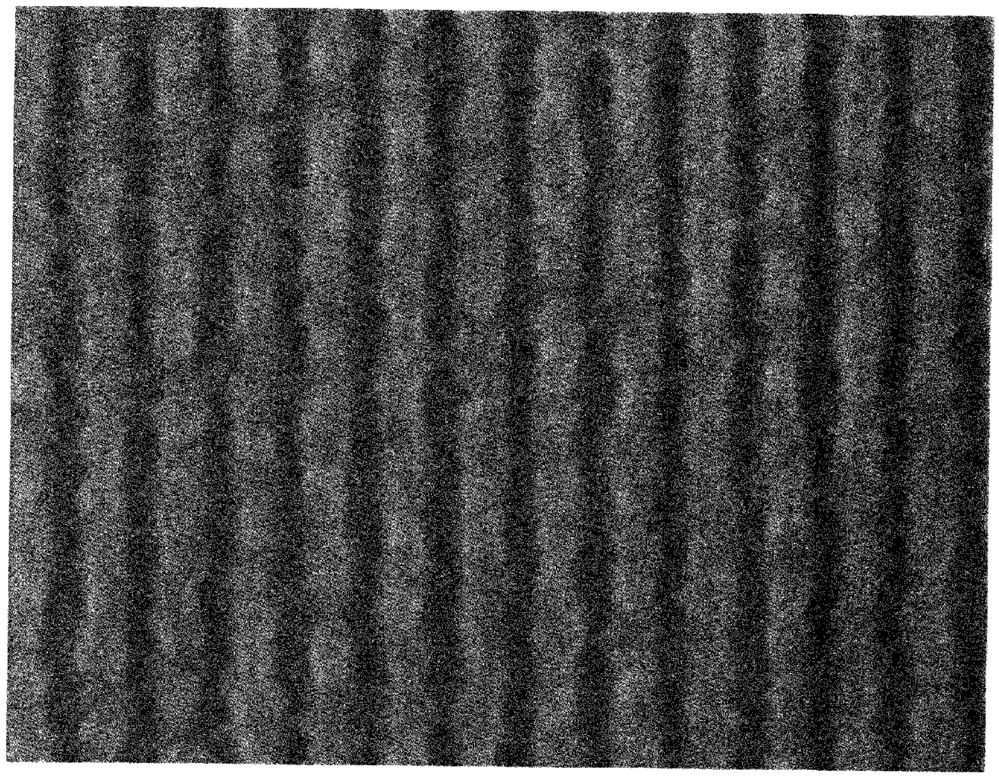
FIG. 10 is an SEM photograph showing a top-down view of 26-nm lines using Formulation 2.
Figure 11:
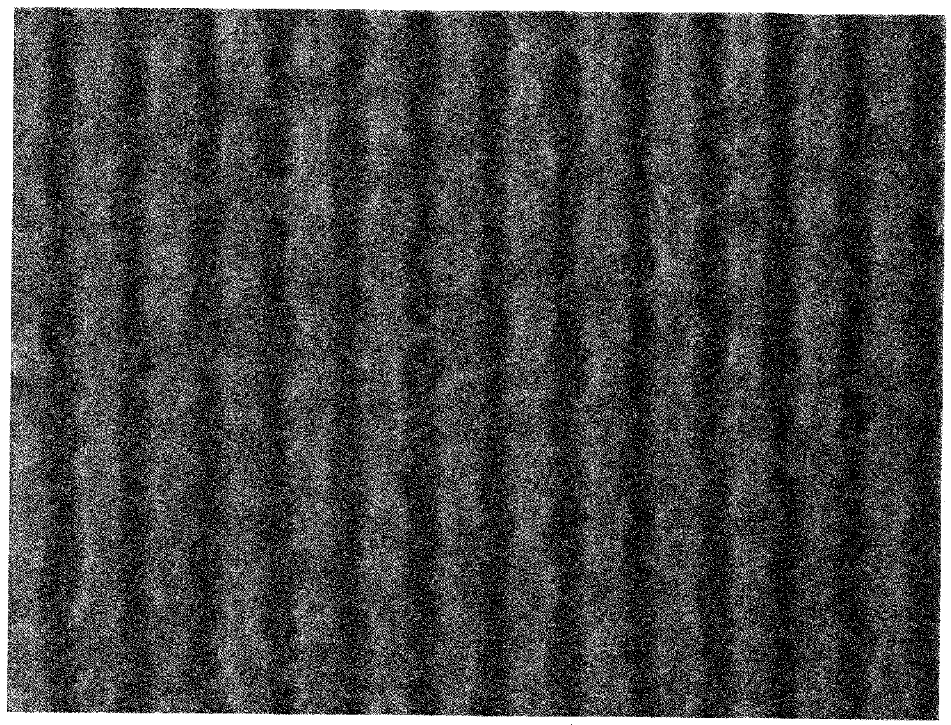
FIG. 11 is an SEM photograph showing a top-down view of 26 nm lines using Formulation 3.
Figure 12:
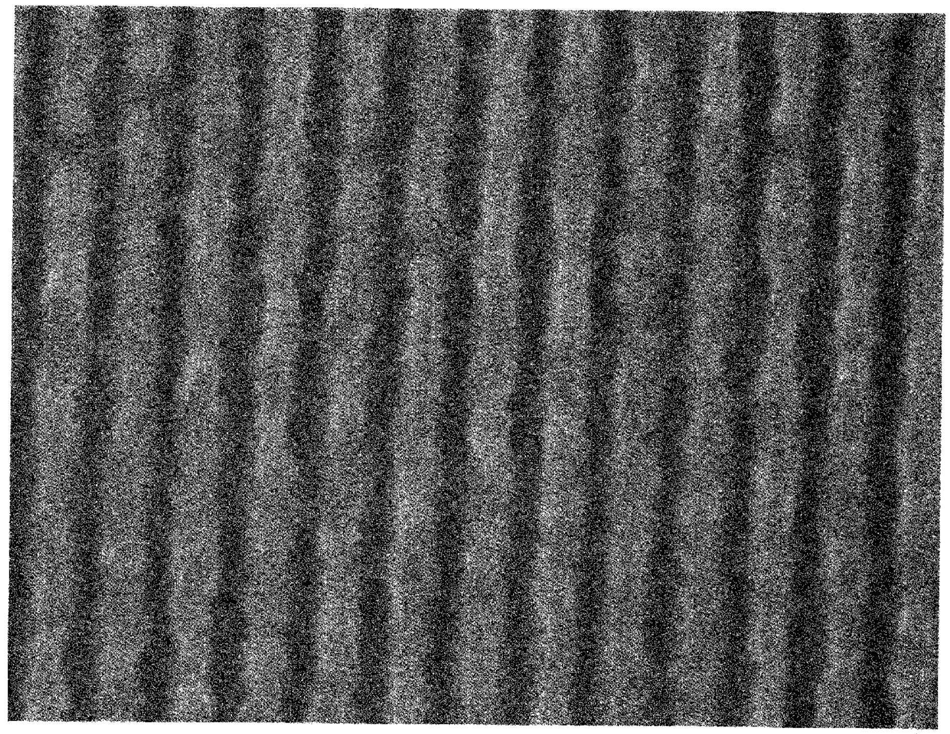
FIG. 12 is an SEM photograph showing a top-down view of 26-nm lines using Formulation 4.
Figure 13:
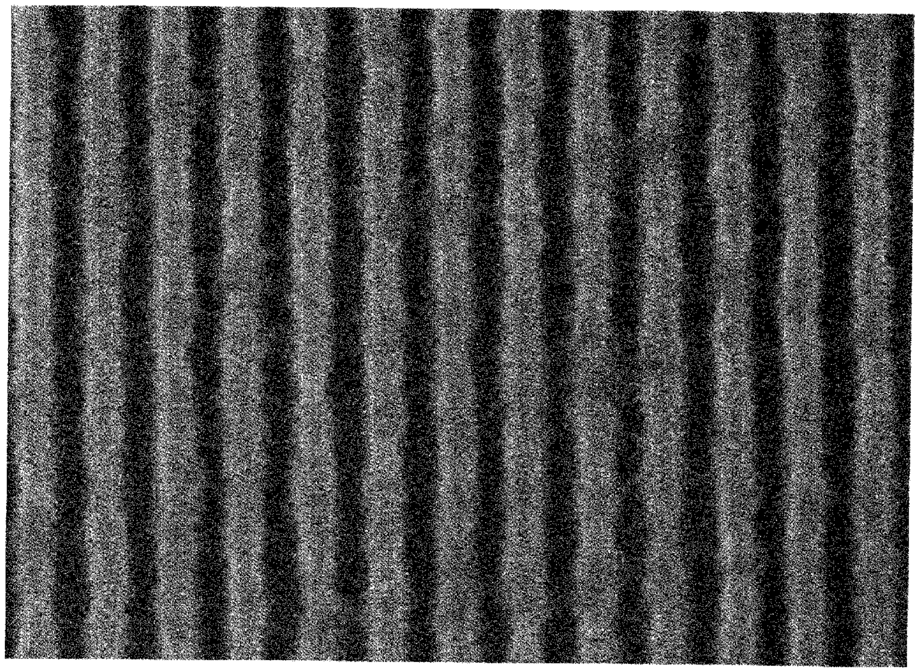
FIG. 13 is an SEM photograph showing a top-down view of 26-nm lines using $E^2$Stack® AL412.
Figure 14:
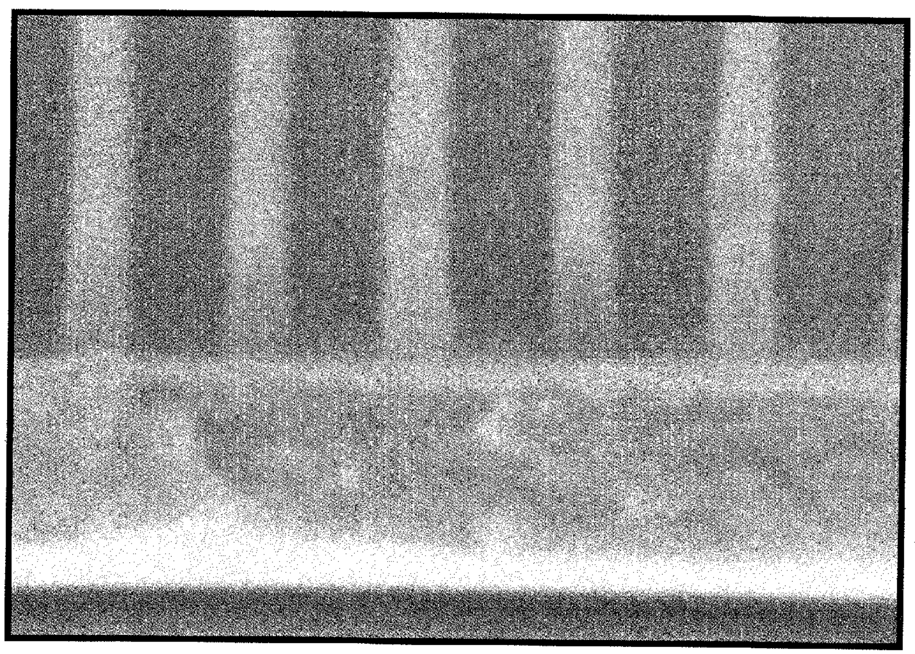
FIG. 14 is an SEM photograph showing a cross-sectional view of 48-nm lines and spaces after lithography, as described in Example 8.
Figure 15:
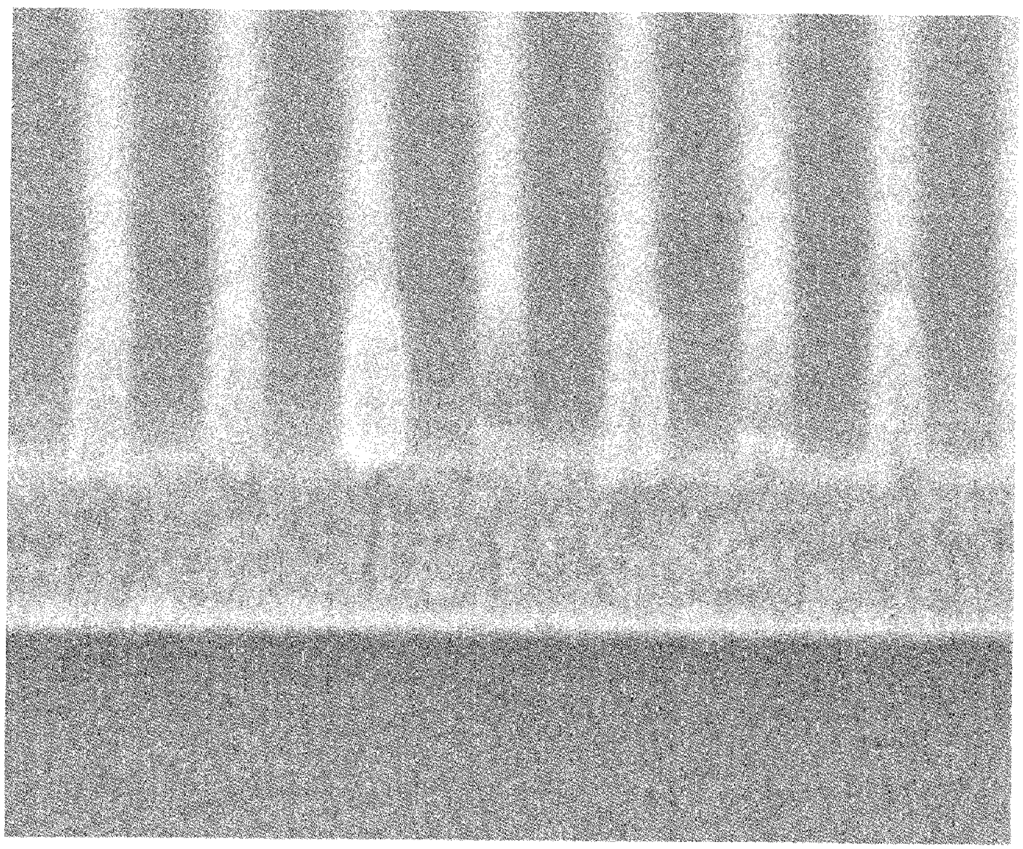
FIG. 15 is an SEM photograph showing a cross-sectional view of 48-nm lines and spaces after $CF_4$ etch, as described in Example 8.
Figure 16:
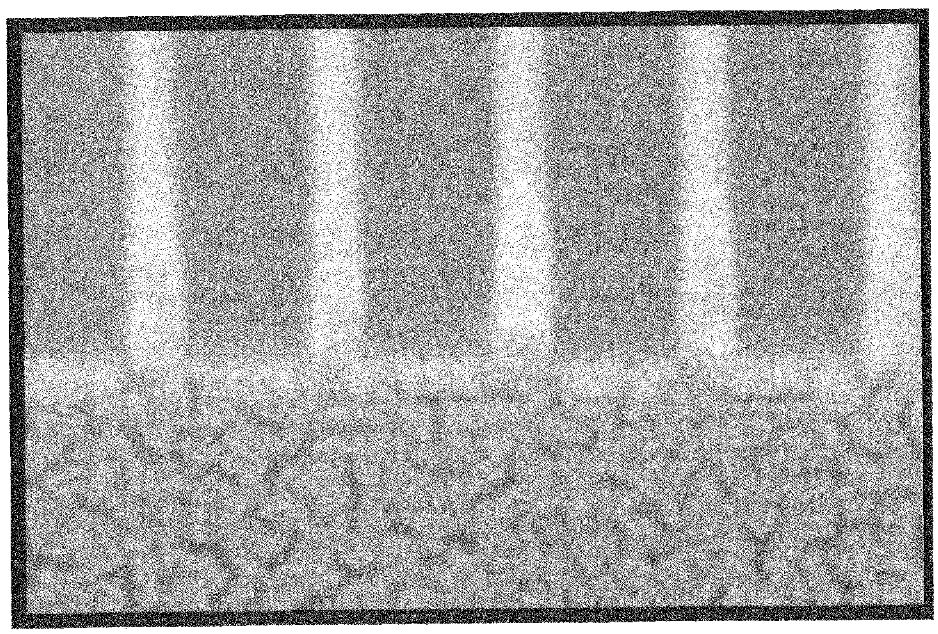
FIG. 16 is an SEM photograph showing a cross-sectional view of 48-nm lines and spaces after Ar:$CO_2$ etch, as described in Example 8.
Figure 17:
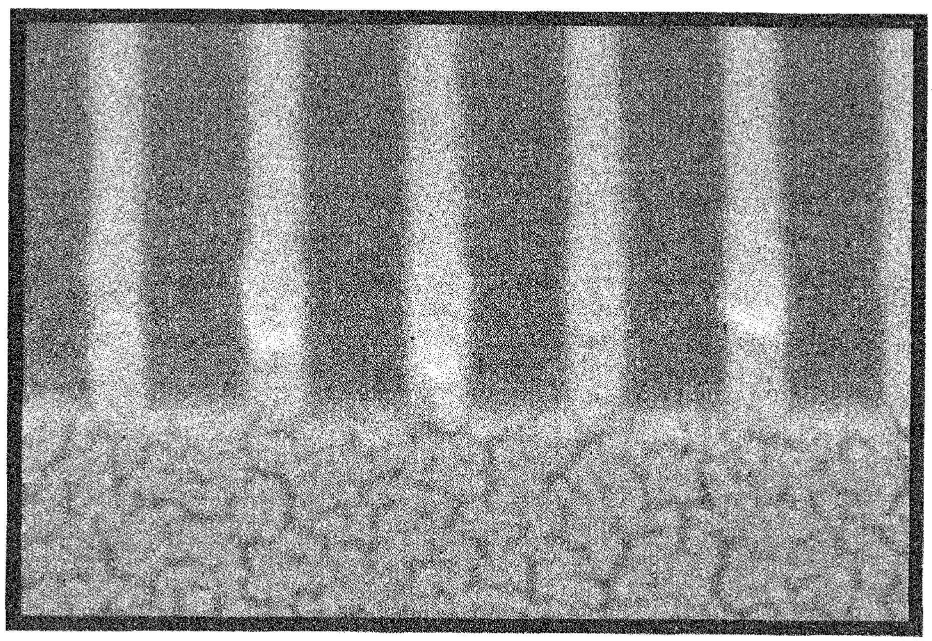
FIG. 17 is an SEM photograph showing a cross-sectional view of 48-nm lines and spaces after $O_2$:N, etch, as described in Example 8.

In more detail, the present invention provides a method of forming a microelectronic structure that is particularly suited for EUV lithography. As used herein, EUV lithography refers to wavelengths of less than about 20 nm, preferably from about 10.5 nm to about 14.5 nm, and more preferably about 13.5 nm.

In the inventive method, a substrate having a surface is provided. Any microelectronic substrate can be utilized. Preferred substrates include those selected from the group consisting of silicon, SiGe, $SiO_2$, $Si_3N_4$, aluminum, $Al_2O_3$, hafnium, zirconium, titanium, magnesium, tungsten, tungsten silicide, gallium arsenide, germanium, tantalum, tantalum nitride, indium, and indium phosphide. The substrate can have a planar surface, or it can include topography features (via holes, trenches, contact holes, raised features, lines, etc.). As used herein, "topography" refers to the height or depth of a structure in or on a substrate surface.

A composition useful for forming an assist layer (discussed in more detail below) is then applied to the substrate to form the assist layer on the substrate. The composition can be applied by any known application method, with one preferred method being spin coating the composition at speeds of from about 350 rpm to about 4,000 rpm (preferably from about 1,000 rpm to about 2,500 rpm) for a time period of from about 20 seconds to about 90 seconds (preferably from about 30 seconds to about 60 seconds). The assist layer is then baked to induce thermal crosslinking of the composition to form a cured assist layer. Preferred baking conditions involve temperatures of at least about 145° C., preferably from about 150° C. to about 250° C., and more preferably from about 175° C. to about 210° C., and for a time period of from about 30 seconds to about 120 seconds (preferably from about 45 seconds to about 90 seconds).

The thickness of the assist layer after baking is preferably from about 1 nm to about 100 nm, more preferably from about 1 nm to about 50 nm, even more preferably from about 1 nm to about 30 nm, and most preferably from about 5 nm to about 20 nm. If the substrate surface includes topography, the assist layer is preferably applied at a thickness sufficient to substantially cover the substrate topography. Additionally, the cured assist layer will have a contact angle with water of from about 50° to about 110°, and preferably from about 65° to about 80°.

Although the above discusses the application of the assist layer directly to the substrate surface, it will be appreciated that in some embodiments there may be one or more intermediate layers applied to the substrate first. In those instances, the assist layer can then be applied to the uppermost intermediate layer rather than to the substrate surface. Examples of possible intermediate layers that could be utilized include those selected from the group consisting of hard masks (including spin-on carbon), organic layers, carbon layers, organo-metallic layers, and barrier layers.

Advantageously, the crosslinked assist layer will be substantially insoluble in typical organic solvents such as ethyl lactate (EL), propylene glycol methyl ether acetate (PGMEA), propylene glycol methyl ether (PGME), propylene glycol n-propyl ether (PnP), cyclohexanone, acetone, gamma butyrolactone (GBL), and mixtures thereof. Thus, when subjected to a stripping test, the crosslinked assist layers will have a percent stripping of less than about 5%, preferably less than about 1%, and even more preferably about 0%. The stripping test involves first determining the thickness (by taking the average of measurements at five different locations) of the cured assist layer. This is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\%\ \text{stripping} = \left(\frac{\text{amount of stripping}}{\text{initial average film thickness}}\right) \times 100.$$

After the assist layer is cured, an EUV photoresist (i.e., imaging layer) can be applied to the assist layer to form a photoresist layer. One significant advantage of the present invention is that the photoresist composition can be selected without concern about modifying the photoresist composition to make it more suitable for EUV applications. For example, there is no need to incorporate a PAG functionality into the photoresist polymer, and in one embodiment, the photoresist polymer utilized is substantially free (i.e., less than about 0.1%, and preferably about 0%) of PAGs or other acid generators. It is also unnecessary to incorporate halogens into the photoresist composition, so that the photoresist composition can also be substantially free (i.e., less than about 0.1%, and preferably about 0%) of halogens, or at least of added halogens.

The photoresist layer can be formed by any conventional method, with one preferred method being spin coating the photoresist composition at speeds of from about 350 rpm to about 4,000 rpm (preferably from about 1,000 rpm to about 2,500 rpm) for a time period of from about 20 seconds to about 90 seconds (preferably from about 30 seconds to about 60 seconds). The photoresist layer is then preferably post-application baked ("PAB") at a temperature of at least about 90° C., preferably from about 100° C. to about 140° C., and more preferably from about 105° C. to about 130° C., and for time periods of from about 30 seconds to about 120 seconds. The thickness of the photoresist layer after baking will typically be from about 40 nm to about 120 nm, preferably from about 45 nm to about 80 nm, and more preferably from about 50 nm to about 70 nm.

The photoresist layer is subsequently patterned by exposure to EUV radiation for a dose of from about 1 $mJ/cm^2$ to about 100 $mJ/cm^2$, preferably from about 5 $mJ/cm^2$ to about 50 $mJ/cm^2$, and more preferably from about 5 $mJ/cm^2$ to about 15 $mJ/cm^2$, followed by development of the exposed photoresist layer. More specifically, the photoresist layer is exposed using a mask positioned above the surface of the photoresist layer. The mask has open areas designed to permit the EUV radiation to reflect from the mask and contact the surface of the photoresist layer. The remaining portions of the mask are designed to absorb the light to prevent the radiation from contacting the surface of the photoresist layer in certain areas. Those skilled in the art will readily understand that the arrangement of open areas and absorbing portions is designed based upon the desired pattern to be formed in the photoresist layer and ultimately in the substrate.

It will be appreciated that the present invention differs from the prior art in that it does not rely on the resist or EUV source to improve resist performance. This concept is different from prior concepts that rely on changing the resist to achieve better LWR and sensitivity. Advantageously, as the photoresist layer is exposed to EUV radiation, the assist layer absorbance is modulated as a source of secondary electron generation. Because the resist and assist layer behave as a single layer in the inventive method, there are no reflection effects, and both materials absorb approximately the same amount of energy. The high-energy EUV photon, which has about 14 times the energy of that of the 193-nm wavelength, and the secondary electron generation enhance the photoresist's acid-generation efficiency, and therefore improve LWR and sensitivity. More advantageously, the assist layer can be designed with a specific chromophore to absorb a specific wavelength that will control the reflectivity of the out-of-band radiation, which will mitigate the negative effect of the out-of-band radiation After EUV exposure, the photoresist layer is preferably subjected to a post-exposure bake ("PEB") at a temperature of less than about 140° C., preferably from about 80° C. to about 140° C., and more preferably from about 90° C. to about 130° C., for a time period of from about 30 seconds to about 120 seconds (preferably from about 45 seconds to about 90 seconds).

The photoresist layer is then contacted with a developer to form the pattern. Depending upon whether the photoresist used is positive-working or negative-working, the developer will either remove the exposed portions of the photoresist layer, or remove the unexposed portions of the photoresist layer, to form the pattern. The pattern is then transferred to the assist layer, any present intermediate layers, and finally the substrate. This pattern transfer can take place via a plasma etch process (e.g., $CF_4$ etchant, $O_2$ etchant) or a wet etching or developing process. In embodiments where the pattern will be transferred from the photoresist layer to the substrate via etching, it is preferred that the etch selectivity of the assist layer relative to a typical EUV photoresist is at least about 1, and preferably from about 1.1 to about 2. These layers preferably etch at a rate that is equal to or less than the rate that the substrate etches. That is, the substrate etch rate over the inventive composition etch rate will be from about 1 to about 5, and more preferably from about 1 to about 4 when the above etchants are used.

In other embodiments, the assist layer utilized can be developer soluble. "Developer soluble" or "wet-developable" as used herein means the portions of the assist layer that have been exposed to EUV radiation can be substantially removed with conventional aqueous developers such as tetramethyl ammonium hydroxide (TMAH) developers. The exposed portions of the assist layer underneath the exposed portions of the photoresist layer are removed by the developer as the photoresist layer is removed to form the desired pattern in the photoresist layer and the assist layer. The pattern can be via holes, trenches, lines, spaces, etc., that will ultimately be transferred to the substrate using an etch or ion implantation process. Preferably, at least about 95% of the exposed portions of the assist layer will be removed by the developer, more preferably at least about 99%, and even more preferably about 100% will be removed. Suitable developers are organic or inorganic alkaline solutions such as TMAH, and preferably comprise an aqueous solution of TMAH at a concentration of 0.26N or lower. Preferably, the dissolution rate of the assist layer in 0.26N TMAH developer will be from about 100 nm/second to about 1,000 nm/second, and even more preferably from 500 nm/second to about 1,000 nm/second. Conventional etching, metallization, etc., can then be carried out on the patterned stack to complete the device manufacture.

In another embodiment, the assist layer utilized can be soluble in non-polar organic solvent. Upon exposure to EUV radiation, the exposed portion of the assist layer is converted to contain an insoluble polar functionality, thereby enabling negative-tone development of the film with a non-polar solvent. The cured assist layer will be soluble in non-polar organic solvents and mixtures of such solvents. Preferably the assist layer is soluble in typical non-polar solvents such as EL, PGMEA, heptanone, butyl acetate, PnP, cyclohexanone, acetone, GBL, and mixtures thereof, more preferably the assist layer is soluble in butyl acetate and mixture of butyl acetate with one or several additives.

Regardless of whether pattern transfer is effected by etching or by developing, the resulting features have high resolutions. For examples, resolutions of less than about 32 nm, and preferably less than 22 nm can be achieved with the inventive method.

Compositions for Use in the Inventive Method

Compositions for use in the present invention are solvent-borne formulations that, when coated on a substrate and heated, result in the formation of a metal-containing film. The composition (and ultimately the metal-containing film) preferably comprises a metal or metal derivative selected from the group consisting of metal halides, metal carbides, metal sulfides, metal nitrides, metal oxides, and mixtures thereof. Such metals and metal derivatives include those selected from the group consisting of Si, $SiO_2$, $Si_3N_4$, AlN, $Al_2O_3$, ZrC, $ZrO_2$, Hf, $HfO_2$, TiN, TiO, $TiO_2$, $Ti_2O_3$, $Mg_3N_2$, MgO, W, WO, $WO_2$, and $WO_3$. The most preferred metals are those that have the ability to absorb energy well at EUV wavelengths. Preferred metals include those selected from the group consisting of Al, Mg, Na, Zn, Co, Cu, Ga, Ge, Hf, Ti, Zr, Se, Ni, V, Ar, Sc, and Si. Such metals will typically have an absorption at EUV wavelengths of at least about 4 $cm^2$/mol, preferably from about 5 $cm^2$/mol to about 9 $cm^2$/mol, and more preferably from about 6 $cm^2$/mol to about 9 $cm^2$/mol.

Regardless of the metal selected, it is preferred that the cured metal-containing film has a total metal content of at least about 0.01% by weight, preferably from about 10% to about 70% by weight, and even more preferably from about 20% to about 50% by weight, based upon the total weight of the cured film taken as 100% by weight. Even more preferably, that metal content is entirely attributable to one or more of the metals listed above. These percentages are achieved by ensuring the source of the metal is present in the composition at levels of at least about 0.05% by weight, preferably from about 0.1% to about 20% by weight, and even more preferably from about 0.5% to about 5% by weight, based upon the total weight of the composition as 100% by weight.

One preferred embodiment uses compositions that form metal oxide films. The metal oxide-forming species can be monomeric, oligomeric, or polymeric in nature, where sol-gel materials and nanoparticles are considered polymeric. Metal alkoxides and diketonates are typical precursors to metal oxides. Monomers can be converted directly to metal oxides in the presence of heat and can be aided by the addition of a catalyst. In some instances, higher molecular weight precursors are desired for solution stability, film formation, or cure rate. Such precursors can be achieved by either the use of multifunctional ligands or the synthesis of sol-gel polymers (partially oxidized monomers). Mixtures of different metal monomers, sol-gels, mixed metal sol-gels, or mixtures containing silicon can be used. Mixtures of various metals and/or silicon can facilitate etch-rate tuning, formulation stability, cure rate, film coat quality, and lithography quality (optical constants and profile control).

Examples of suitable polymeric metal alkoxides include those comprising recurring units having the formula

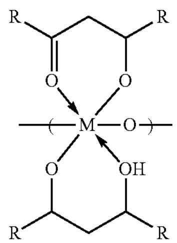

where each R is individually selected from the group consisting of hydrogen, and alkyl groups (preferably $C_1$-$C_8$ alkyls), and M is a metal, such as those described above. The most preferred R groups are selected from the group consisting of —CH, and —$CH_2$—$CH_3$. Other suitable compositions are also described in U.S. Pat. No. 6,740,469, incorporated by reference herein.

In another embodiment, the composition will include a polymer having recurring monomers of polyhedral oligomeric silsesquioxane compounds such as those commercialized by Hybrid Plastics under the name POSS and/or the composition will include polyhedral oligomeric silsesquioxane compounds. One such compound has the formula (I)

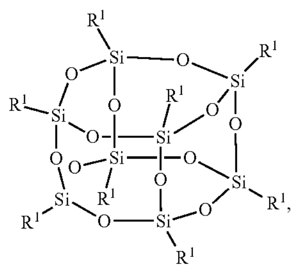

where each $R^1$ is individually selected from the group consisting of hydrogen, alkyls (preferably $C_1$-$C_{12}$, and more preferably $C_1$-$C_6$), aryls (preferably $C_6$-$C_{18}$, and more preferably $C_6$-$C_{12}$), hydroalkylsilyloxys, and olefinic moieties. One preferred hydroxyalkylsilyloxy is one having the formula:

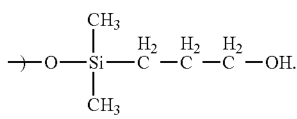

In embodiments where the compound (I) is present as part of a polymer, the polymerization preferably takes place via an olefin group on $R^1$. Thus, at least one $R^1$ will include an olefinic moiety (such as in methacrylates or acrylates). In this embodiment, it is also preferred that at least one $R^1$ in (I) is

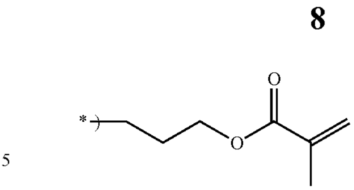

where "*" designates a silicon atom on (I).

In some embodiments, a PAG or even thermal acid generator (TAG) is utilized. Preferably, the PAG or TAG is not attached to the polymer, oligomer, or small molecule, but instead is simply mixed into the assist layer composition. Preferred PAGs include those selected from the group consisting of: onium salts (e.g., triphenyl sulfonium perfluorosulfonates such as TPS nonaflate, TPS triflate, and substituted forms thereof, such as tris(4-tert-butylphenyl)sulfonium perfluoro-1-butanesulfonate (an alkyl-substituted TPS nonaflate), all available from Sigma-Aldrich); oxime-sulfonates (e.g., those sold under the name CGI® by CIBA); triazines (e.g., TAZ-108® available from Midori Kagaku Company); and combinations thereof. The PAG should be present in the compositions at a level of from about 0.001% to about 20% by weight, and preferably from about 2% to about 6% by weight, based upon the total weight of the solids in the composition taken as 100% by weight.

In another embodiment, the assist layer composition utilized is substantially free of any acid generator such as a PAG. That is, the assist layer composition will comprise less than about 0.001% by weight acid generator, and preferably about 0% by weight acid generator, based upon the total weight of the solids in the composition taken as 100% by weight.

In another embodiment, the assist layer composition may contain a quencher to trap excess acid, more preferably a photodecomposable component that acts as an acid scavenger in the unexposed area, thus reducing the acid diffusion in these areas. Preferably, the quencher is not attached to the polymer, but rather physically mixed into the assist layer. In these embodiments, the composition should include quencher at a level of from about 0.001% to about 20% by weight, and preferably from about 1% to about 5% by weight, based upon the total weight of the polymer solids taken as 100% by weight.

Preferred crosslinkers for use in the metal-containing compositions are selected from the group consisting of vinyl ether crosslinkers, aminoplasts (e.g., those sold under the name Powderlink® or Cymel®), epoxies, and mixtures thereof. Examples of commercially available vinyl ethers include those sold under the trade name VECTomer™ (Aldrich; St. Louis, Mo.). An example of suitable epoxies include those available under the name Araldite® (e.g., MY720 tetra functional epoxy resin) from Huntsman Advanced Materials. When utilized, the crosslinker is preferably present in the composition at a level of from about 0.01% to about 50% by weight, and preferably from about 0.01% to about 30% by weight, based upon the total weight of the solids in the composition taken as 100% by weight.

More preferably, the vinyl ether crosslinkers for use in the compositions have the formula

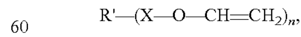

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6.

The most preferred vinyl ethers include those selected from the group consisting of ethylene glycol vinyl ether, trimethylolpropane trivinyl ether, 1,4-cyclohexane dimethanol divinyl ether, and mixtures thereof.

In some embodiments, the composition for forming the assist layer comprises an acid catalyst. Preferred catalysts are selected from the group consisting of sulfonic acids (e.g., p-toluenesulfonic acid, styrene sulfonic acid), sulfonates (e.g., pyridinium p-toluenesulfonate, pyridinium trifluoromethanesulfonate, pyridinium 3-nitrobenzensulfonate), and mixtures thereof. The compositions can comprise from about 0.1% to about 2% by weight catalyst, and preferably from about 0.3% to about 1% by weight catalyst, based upon the total weight of solids in the composition taken as 100% by weight.

In another embodiment, the composition for forming the assist layer comprises a base or a salt catalyst. Preferred such catalysts are ammonium halide salts (e.g., benzyltrimethyl ammonium chloride, henzyltriethylammonium chloride). The compositions can comprise from about 0.1% to about 2% by weight catalyst, and preferably from about 0.3% to about 1% by weight catalyst, based upon the total weight of solids in the composition taken as 100% by weight.

In another embodiment, the assist layer composition is substantially free of catalyst. That is, the assist layer composition will comprise less than about 0.001% by weight catalyst, and preferably about 0% by weight catalyst, based upon the total weight of the solids in the composition taken as 100% by weight.

In some embodiments, a chromophore can be incorporated to control reflectivity of the out-of-band radiation. In these instances, the chromophore can be bonded to the metal-containing compound or polymer, or it can be physically mixed into the composition. If a chromophore is utilized, it typically present at levels of from about 0.1% to about 20% by weight, and preferably from about 1% to about 10% by weight, based upon the total weight of the solids in the composition taken as 100% by weight. Preferred solvent systems include a solvent selected from the group consisting of PGMEA, PGME, PnP, EL, cyclohexanone, GBL, methyl isobutyl carbinol, and mixtures thereof. Preferably, the solvent system has a boiling point of from about 70° C. to about 200° C., and more preferably from about 100° C. to about 150° C. The solvent system should be utilized at a level of from about 97% to about 99.5% by weight, and preferably from about 98% to about 99% by weight, based upon the total weight of the composition taken as 100% by weight. The compositions used to form the assist layers will preferably comprise a solids content of from about 0.5% to about 3% by weight solids, and more preferably from about 1% to about 2% by weight solids, based upon the total weight of the composition taken as 100% by weight.

Mixing the above ingredients together in the solvent system forms the assist layer composition. Furthermore, any optional ingredients (e.g., surfactants) are also dispersed in the solvent system at the same time.

It will be appreciated that the foregoing invention provides a number of advantages over the prior art. For instance, the assist layers aid in the photo-imaging of the resist and in subsequent etch processes. The assist layer also decreases the dose of EUV energy necessary to image the photoresist by providing a secondary electron source. The assist layer further aids in the formation of sharp images in the photoresist by absorbing out-of-band radiation, which could negatively impact the imaging abilities of the photoresist. Finally, the chemical composition of the assist layer allows it to act as a hardmask, which allows better pattern transfer from the photoresist into the underlying substrate and/or intermediate layers.

EXAMPLES

The following examples set forth preferred methods in accordance with the invention. It is to be understood, however, that these examples are provided by way of illustration and nothing therein should be taken as a limitation upon the overall scope of the invention.

Example 1

Preparation of Coating Using Sol-Gel Silicon Platform

In this procedure, 7.498 grams of tetraethoxysilane (Gelest, Morrisville, Pa.), 4.998 grams of 2-(3,4-epoxycyclohexyl)ethyl trimethoxysilane (Gelest), 12.496 grams of methyltrimethoxysilane (Gelest), and 58.315 grams of PGME (Ultra Pure Solutions, Inc., Castroville, Calif.) were added to a round-bottom flask. Over a 10-minute period, a solution of 2.937 grams of acetic acid (Sigma Aldrich) and 13.756 grams of water was added to the flask while stirring. The round-bottom flask was Fitted with a distillation head, distillation column, and collection flask. The solution was heated at 95° C. for 5 hours. By-products (water and methanol) were removed during the reaction. The final solution was used as ML-2 (discussed below) directly, without further purification.

Next, 3.096 grams of ML-2, 0.155 grams of 1 wt % benzyltriethylammonium chloride ("BTEAC," Alfa Aesar, Ward Hill, Mass.) in PGME, 67.724 grams of PGME, 29.025 grams of PGMEA, and 0.01 grams of NDS-105 (a PAG, Midori Kagaku, Tokyo, Japan) were mixed until homogeneous, and were then filtered through a 0.2-μm end-point filter to produce Formulation 1A.

Another formulation was prepared by mixing 3.096 grams of ML-2, 0.155 grams of 1 wt % BTEAC in PGME, 67.724 grams of PGME, 29.025 grams of PGMEA, and 0.02 grams of NDS-105 until homogeneous, followed by filtering through a 0.2-μm end-point filter to produce Formulation 1B.

A third formulation was prepared by mixing 3.096 grams of ML-2, 0.155 grams of 1 wt % BTEAC in PGME, 67.724 grams of PGME, 29.025 grams of PGMEA, 0.015 grams of bisphenol A (Sigma-Aldrich, St. Louis, Mo.), and 0.01 grams of NDS-105 until homogeneous, followed by filtering through a 0.2-μm end-point filter to produce Formulation 1C.

Formulations 1A, 1B, and 1C were formed into individual 20-nm thick films by spin coating on a 4-inch silicon wafer at 1,500 rpm for 60 seconds, followed by baking at 205° C. for 1 minute. Ethyl lactate stripping was measured to be less than 0.5%, which means no obvious film loss or swelling occurred.

Example 2

Preparation of Coating Using Sol-Gel Silicon Platform

In this Example, 20.32 grams of tetraethoxysilane, 34.04 grams of 75% titanium diisopropoxide bis(-2,4-pentandionate) in isopropanol (Gelest), and 41.43 grams of PGME were added to a round-bottom flask. Over a 10-minute period, a solution of 0.70 gram of acetic acid (Sigma Aldrich) and 3.51 grams of water was added to the flask while stirring. The round-bottom flask was fitted with a distillation head, distillation column, and collection flask. The solution was heated at 95° C. for 5 hours. By-products (water and methanol) were removed during the reaction, after which 21.44 grams of the resulting solution, 5.52 grams of 0.55 wt % BTEAC in PGME, 25.10 grams of PGME, and 47.94 grams of PGMEA were mixed until homogeneous. The homogenous mixture was filtered through a 0.2-μm end-point filter to produce Formulation 2. Formulation 2 was formed into a 20-nm thick film by spin coating on a 4-inch silicon wafer at 1,500 rpm for 60 seconds, followed by baking at 205° C. for 1 minute. Ethyl lactate stripping was measured to be less than 0.5%, which means no obvious film loss or swelling occurred.

Example 3

Preparation of Coating Using Sol-Gel Silicon Platform

In this procedure, 15.23 grams of tetraethoxysilane, 34.20 grams of 60% zirconium di-n-butoxide bis(-2,4-pentandionate) in n-butanol (Gelest) and 46.25 grams of PGME (Ultra Pure Solutions, Inc.) were added to a round-bottom flask. Over a 10-minute period, a solution of 0.63 gram of acetic acid (Sigma Aldrich) and 2.69 grams of water was added to the flask while stirring. The round-bottom flask was fitted with a distillation head, distillation column, and collection flask. The solution was heated at 95° C. for 5 hours. By-products (water and methanol) were removed during the reaction, after which 21.86 grams of the resulting solution, 5.44 grams of 0.55 wt % BTEAC in PGME, 24.66 grams of PGME, and 48.04 grams of PGMEA were mixed until homogeneous. The homogeneous mixture was then filtered through a 0.2-μm end-point filter to produce Formulation 3. Formulation 3 was formed into a 20-nm thick film by spin coating on a 4-inch silicon wafer at 1,500 rpm for 60 seconds, followed by baking at 205° C. for 1 minute. Ethyl lactate stripping was measured to be less than 0.5%, which means no obvious film loss or swelling occurred.

Example 4

Preparation of Coating Using Sol-Gel Silicon Platform

In this procedure, 5.61 grams of tetraethoxysilane, 13.02 grams of methyltrimethoxysilane, 1.13 grams of 9-anthracene carboxylic acid, 1.50 grams of titanium isopropoxide (Gelest), 10.35 grams of a water, 2.09 grams of acetic acid, and 66.3 grams of PGME were mixed and reacted at 95° C. under a nitrogen environment for 5 hours. By-products (water and methanol) were removed during the reaction. Next, 10.04 grams of the resulting solution, 1.03 grams of 0.55 wt % BTEAC in PGME, 65.41 grams of PGME, and 27.72 grams of PGMEA were mixed until homogeneous, and were then filtered through a 0.1-μm end-point filter to produce Formulation 4.

Formulation 4 was formed into a 20-nm thick film by spin coating on a 4-inch silicon wafer at 1,500 rpm for 60 seconds, followed by baking at 205° C. for 1 minute. Ethyl lactate stripping was measured to be less than 0.5%, which means no obvious film loss or swelling occurred.

Example 5

Preparation of Coating Using Sol-Gel Silicon Platform

In this Example, 2.83 grams of phenyl trimethoxysilane, 4.86 grams of 2-(3,4-epoxycyclohexyl)ethyl trimethoxysilane, 7.94 grams of methyltrimethoxysilane, 12.40 grams of tetraethoxysilane (Gelest), 13.86 grams of a 3N acetic acid solution (17.6% acetic acid and 82.4% water), and 58.30 grams of PGMEA were mixed and reacted at 95° C. under a nitrogen environment for 5 hours. By-products (water and methanol) were removed during the reaction. Next, 5.8397 grams of the resulting solution, 1.3166 grams of 0.4 wt % BTEAC in PGME, 63.13 grams of PGME, 24.84 grams of PGMEA, and 4.8761 grams of TPS-109 (Midori Kagaku, Tokyo, Japan) were mixed until homogeneous, followed by filtering through a 0.1-μm end-point filter to produce Formulation 5.

Formulation 5 was formed into a 20-nm thick film by spin coating on a 4-inch silicon wafer at 1,500 rpm for 60 seconds, followed by baking at 205° C. for 1 minute. Ethyl lactate stripping was measured to be less than 0.5%, which means no obvious film loss or swelling occurred.

Example 6

Preparation of Coating Using Sol-Gel Silicon-Aluminum Platform

In this procedure, 5.50 grams of phenyltrimethoxysilane, 16.45 grams of vinyltrimethoxysilane (Gelest), 15.11 grams of methyltrimethoxysilane, 19.03 grams of a 75% solids solution of aluminum diisopropoxide ethylacetoacetate in IPA (Gelest) diluted to 40% solids by added PGMEA, and 88.58 grams of PGMEA were added to a round-bottom flask. Over a 10-minute period, 17.22 grams of a 3N acetic acid solution (17.6% acetic acid and 82.4% water) were added to the flask while stirring. The round-bottom flask was fitted with a distillation head, distillation column, and collection flask. The solution was heated at 95° C. for 5 hours. Next, 5.20 grams of this solution was mixed with 0.4189 grams of 1% BTEAC in PGME, 49.153 grams of PGME, and 45.2137 grams of PGMEA until a homogeneous solution was obtained. The solution was filtered through a 0.02-μm end-point filter to produce Formulation 6.

Example 7

Lithography Results

A spin on carbon hardmask, Opti Stack® SOC110D-310 (Brewer Science, Inc.) was coated onto a silicon wafer at 1,500 rpm for 60 seconds, followed by baking at 205° C. for 60 seconds to form a film having a thickness of 100 nm. Various formulations were then coated onto wafers at ~1,500 rpm for 30 seconds, followed by baking at 205° C. for 60 seconds to form a film having a thickness of 20 nm. An EUV resist was applied to the film followed by a 105° C. bake for 60 seconds, then an exposure at 13.5 nm wavelength and developing with 0.26N TMAH for 30 seconds.

Results were compared to E2Stack® AL412 material (an EUV assist layer, Brewer Science, Inc.). These results are shown in Table 1 and FIGS. 1-13.

TABLE 1

Dose to Size for Various Assist Layer Formulations

| | 30-nm | | 26-nm | |
|---|---|---|---|---|
| Formulation | Dose to size mJ/cm$^2$ | % Reduction in dose | Dose to size mJ/cm$^2$ | % Reduction in dose |
| 1A | 9.7 | 17 | 10.5 | 13 |

TABLE 1-continued

Dose to Size for Various Assist Layer Formulations

| Formulation | 30-nm | | 26-nm | |
|---|---|---|---|---|
| | Dose to size $mJ/cm^2$ | % Reduction in dose | Dose to size $mJ/cm^2$ | % Reduction in dose |
| 1C | 9.4 | 19 | | |
| 2 | 8.4 | 28 | 9.5 | 21 |
| 3 | 6.8 | 42 | 7.6 | 37 |
| 4 | 7.3 | 37 | 8.0 | 34 |
| $E^2$Stack ® AL412 | 11.7 | N/A | 12.1 | N/A |

Example 8

Lithography Results

A spin on carbon hardmask, Opti Stack® SOC110D-310 (Brewer Science, Inc.) was coated onto a silicon wafer at 1,500 rpm for 60 seconds, followed by baking at 205° C. for 60 seconds to form a film having a thickness of 100 nm. Various dilutions of Formulation 6 were then coated onto wafers at ~1,500 rpm for 60 seconds, followed by baking at 205° C. for 60 seconds to form films of various thicknesses. An ArF resist was applied to the film followed by a 105° C. bake for 60 seconds, then an exposure at a wavelength of 193 nm and developing with 0.26N TMAH for 30 seconds.

Three successive etches were performed. The first etch was used to open the assist layer, and used $CF_4$ gas at 35 sccm flow, 50 mTorr pressure, 100 W power, and 357 V DC bias. The second etch was used to open the SOC, and used Ar:$CO_2$ at 25 sccm flow for both gases, 20 mTorr pressure, 300 W power, and 736 V DC bias. Finally, the third etch was also for the SOC, and used $O_2$:$N_2$ at 20 sccm flow for both gases, 20 mTorr pressure, 300 W power, and 705 V DC bias. Pattern transfer was successful, but some CD edge trimming was observed. FIGS. 14-17 show these results.

Example 9

Lithography Results

Figure 18:
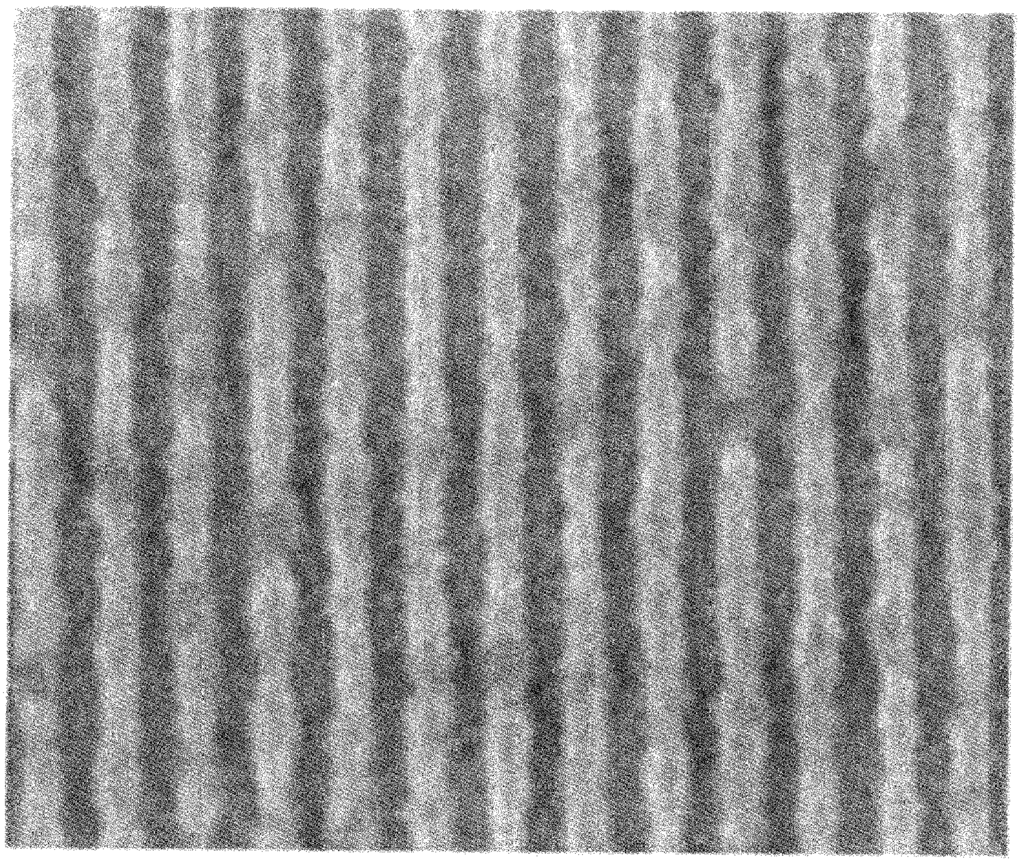
FIG. 18 is an SEM photograph showing a top-down view of 28-nm lines and spaces after EUV lithography, as described in Example 9 (Formulation 6).

Formulation 6 was used in a multilayer stack that included an underlayer, the assist layer, and an EUV resist. Without the use of Formulation 6, the Dose to Size was measured to be 9.4 $ml/cm^2$. Use of Formulation 6 as an assist layer reduced the Dose to Size to 7.8 $mJ/cm^2$ and allowed patterning of 28 nm lines and spaces, shown in FIG. 18.

We claim:

1. A method of forming a structure, said method comprising:

providing a substrate, said substrate optionally including one or more intermediate layers thereon;

spin coating a composition to form an assist layer on said substrate, or on said one or more intermediate layers, if present, said assist layer being a cured film comprising at least about 0.01% by weight metal, based upon the total weight of the cured film taken as 100% by weight;

forming a photoresist layer on said assist layer; and subjecting at least a portion of said photoresist layer to EUV radiation.

2. The method of claim 1, said metal being selected from the group consisting of Al, Mg, Na, Zn, Co, Cu, Ga, Ge, Hf, Ti, Zr, Se, Ni, V, Ar, Sc, and Si.

3. The method of claim 1, said assist layer being formed from a composition comprising a metal or metal derivative selected from the group consisting of metal halides, metal carbides, metal sulfides, metal nitrides, metal oxides, and mixtures thereof.

4. The method of claim 3, wherein said metal or metal derivative is selected from the group consisting of Si, $SiO_2$, $Si_3N_4$, AlN, $Al_2O_3$, ZrC, $ZrO_2$, Hf, $HfO_2$, TiN, TiO, $TiO_2$, $Ti_2O_3$, $Mg_3N_2$, MgO, W, WO, $WO_2$, and $WO_3$.

5. The method of claim 1, wherein said substrate is selected from the group consisting of silicon, SiGe, $SiO_2$, $Si_3N_4$, aluminum, $Al_2O_3$, hafnium, zirconium, titanium, magnesium, tungsten, tungsten silicide, gallium arsenide, germanium, tantalum, tantalum nitride, indium, and indium phosphide.

6. The method of claim 1, wherein said assist layer is formed from a composition comprising a crosslinking agent.

7. The method of claim 1, wherein said subjecting said photoresist layer to EUV radiation is carried out with a dose of from about 5 $mJ/cm^2$ to about 100 $mJ/cm^2$.

8. The method of claim 1, further comprising forming a pattern in said photoresist layer after said subjecting of said photoresist layer to EUV radiation.

9. The method of claim 8, further comprising transferring said pattern to said assist layer; to said intermediate layers, if present; and to said substrate.

10. The method of claim 9, wherein said transferring said pattern comprises etching said assist layer; intermediate layers, if present; and said substrate.

11. The method of claim 9, wherein said pattern has a resolution of less than about 32 nm.

12. The method of claim 8, wherein said forming a pattern in said photoresist layer comprises contacting said photoresist layer with a developer so as to remove some of said photoresist layer.

13. The method of claim 1, wherein said assist layer is formed from a composition that is substantially free of photoacid generators.

14. The method of claim 1, said substrate including one or more intermediate layers, one of said intermediate layers being the uppermost intermediate layer, and said uppermost intermediate layer being a carbon layer.

15. A method of forming a structure, said method comprising:

providing a substrate, said substrate optionally including one or more intermediate layers thereon;

forming an assist layer on said substrate, or on said one or more intermediate layers, if present, said assist layer formed from a composition comprising a crosslinking agent and being a cured film comprising at least about 0.01% by weight metal, based upon the total weight of the cured film taken as 100% by weight;

forming a photoresist layer on said assist layer; and subjecting at least a portion of said photoresist layer to EUV radiation.

* * * * *